United States Patent
Barsun (10) Patent No.: US 7,262,964 B1
(45) Date of Patent: Aug. 28, 2007

(54) AIRFLOW CONTROL BAFFLE

(75) Inventor: Stephan K. Barsun, Sacramento, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 328 days.

(21) Appl. No.: 11/115,559

(22) Filed: Apr. 27, 2005

(51) Int. Cl.
*H05K 7/20* (2006.01)

(52) U.S. Cl. .................. 361/695; 361/719; 174/16.1; 174/16.3; 454/184; 165/80.3; 165/104.33

(58) Field of Classification Search .................. None
See application file for complete search history.

(56) References Cited

U.S. PATENT DOCUMENTS

| | | | |
|---|---|---|---|
| 4,174,065 A * | 11/1979 | Knauth | 236/49.1 |
| 4,894,749 A | 1/1990 | Elko et al. | |
| 4,953,058 A | 8/1990 | Harris | |
| 5,276,585 A | 1/1994 | Smithers | |
| 5,282,114 A * | 1/1994 | Stone | 361/687 |
| 5,353,191 A | 10/1994 | Volz et al. | |
| 5,375,655 A | 12/1994 | Lee | |
| 5,381,305 A | 1/1995 | Harmon et al. | |
| 5,563,768 A * | 10/1996 | Perdue | 361/695 |
| 5,828,549 A | 10/1998 | Gandre et al. | |
| 5,862,038 A | 1/1999 | Suzuki et al. | |
| 5,886,871 A | 3/1999 | Jeffries et al. | |
| 5,912,802 A | 6/1999 | Nelson | |
| 5,914,858 A | 6/1999 | McKeen et al. | |
| 6,025,990 A | 2/2000 | Daskalakis et al. | |
| 6,034,870 A | 3/2000 | Osborn et al. | |
| 6,084,774 A | 7/2000 | Talbot et al. | |
| 6,278,608 B1 | 8/2001 | Ater et al. | |
| 6,317,320 B1 | 11/2001 | Cosley et al. | |
| 6,345,665 B1 | 2/2002 | Schulz-Harder | |
| 6,351,381 B1 | 2/2002 | Bilski et al. | |
| 6,381,147 B1 | 4/2002 | Hayward et al. | |
| 6,397,929 B1 | 6/2002 | Sterner | |
| 6,483,699 B1 | 11/2002 | Salmonson et al. | |
| 6,483,700 B1 | 11/2002 | Malone et al. | |
| 6,504,718 B2 | 1/2003 | Wu | |
| 6,512,672 B1 | 1/2003 | Chen | |
| 6,661,666 B1 | 12/2003 | Dauksher | |
| 6,707,676 B1 | 3/2004 | Geva et al. | |
| 6,724,624 B1 | 4/2004 | Dodson | |
| 6,781,831 B1 | 8/2004 | Banton et al. | |
| 7,009,839 B2 * | 3/2006 | Clinard | 361/685 |
| 7,077,893 B2 * | 7/2006 | Guilliard | 96/414 |
| 7,139,170 B2 * | 11/2006 | Chikusa et al. | 361/695 |

* cited by examiner

*Primary Examiner*—Boris Chervinsky (57) ABSTRACT

An apparatus includes a printed circuit board having a first space, a member movably coupled to the printed circuit board and a baffle carried by the member. The baffle is configured to move to an extended position, which is maintained in the absence of a component in the space, to a retracted position in response to engaging a component in the space.

39 Claims, 8 Drawing Sheets

AIRFLOW CONTROL BAFFLE

BACKGROUND

Electronic devices, such as servers, may include one or more components that generate heat. Such devices may additionally include a fan or blower for creating air flow to remove the heat and cool the heat generating components. In some instances, voids may reduce the air flow across the heat generating components by allowing bypass, potentially lessening the cooling of the components.

DETAILED DESCRIPTION OF EXAMPLE EMBODIMENTS

Figure 1:
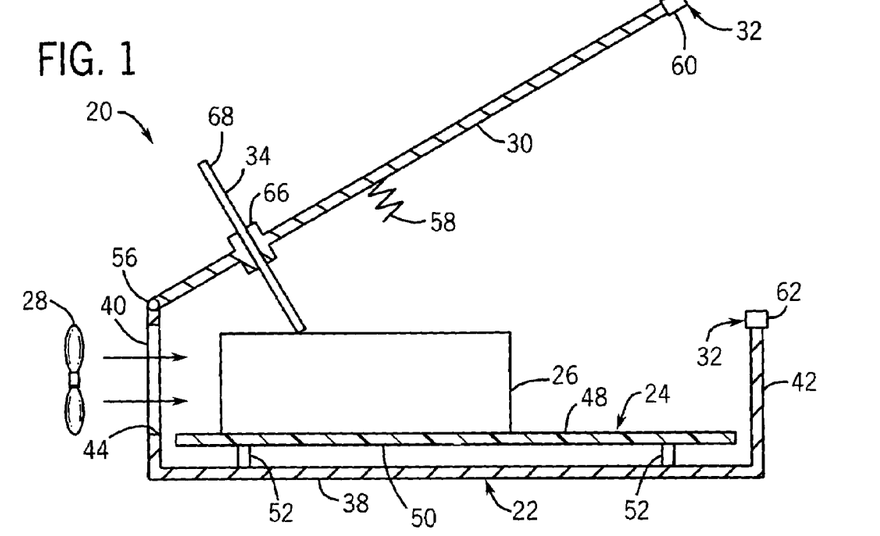
FIG. 1 is a sectional view schematically illustrating an electronic device having a member carrying a baffle and in a raised position according to one exemplary embodiment.
Figure 2:
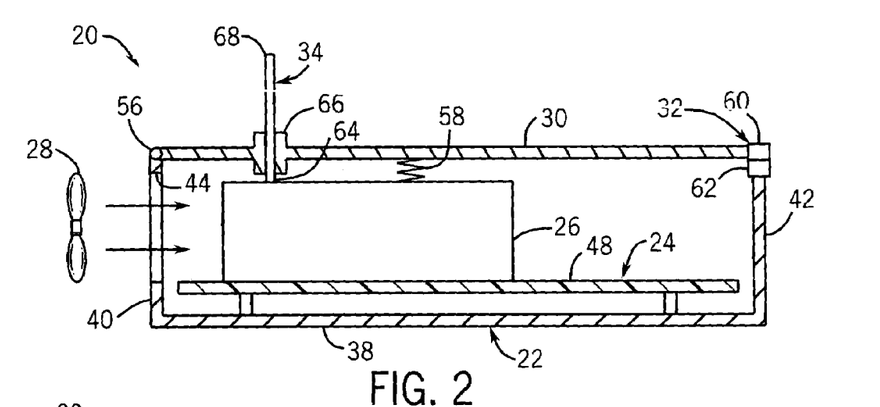
FIG. 2 illustrates the electronic device of FIG. 1 with the member in a lowered position in the presence of an electronic component according to one exemplary embodiment.
Figure 3:
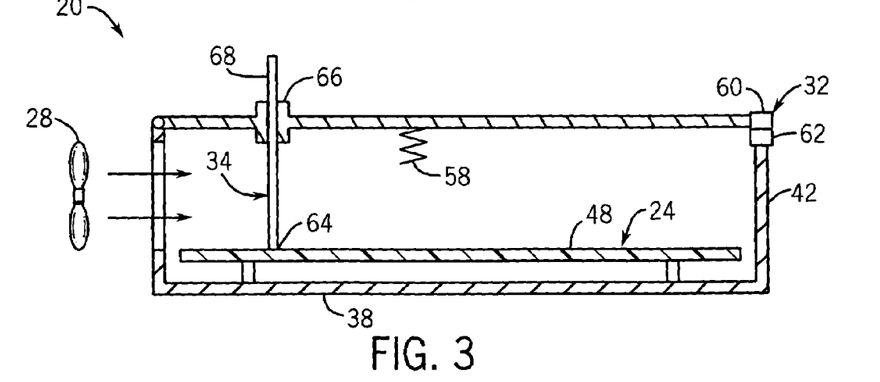
FIG. 3 illustrates the electronic device of FIG. 1 with the member in a lowered position in the absence of an electronic component according to one exemplary embodiment.

FIGS. 1-3 schematically illustrate an electronic device 20 which generally includes housing or frame 22, printed circuit board 24, electronic component 26, fan 28, member 30, latching mechanism 32 and baffle 34. Frame 22 comprises a generally rigid structure formed by one or more members which serves as a foundation and/or enclosure for printed circuit board 24 and component 26. In the example shown, frame 22 includes floor 38 and walls 40, 42. Floor 38 supports and rigidifies printed circuit board 24. Wall 40 projects from floor 38 and includes one or more openings 44 through which airflow created by fan 28 may pass. In other embodiments, wall 40 may omit openings 44 where fan 28 is contained between walls 40 and 42. Wall 40 further movably supports member 30.

Wall 42 extends from floor 38 generally opposite to wall 40. Wall 42 supports latch mechanism 32. In one embodiment, wall 42 may include one or more openings through which airflow may pass. In some embodiments, wall 42 may include openings (not shown) for permitting external connections to device 20. In one embodiment, floor 38 and walls 40, 42 are formed from formed sheet metal. In other embodiments, frame 22 may be formed from other materials.

Printed circuit board 24 supports and serves as an electrical interface between multiple electronic components including component 26. Printed circuit board 24 includes multiple spaces along its surface 48 for the reception or connection to electronic components. The spaces along surface 48 may include connectors, sockets, electrical contact pads and the like to facilitate mounting and/or connection of components within the space to surface 48 of printed circuit board 24. In the particular example shown, printed circuit board 24 is mounted to and spaced from floor 38 of frame 22 by standoffs 52. In other embodiments, printed circuit board 24 may be mounted or secured to frame 22 by other structures.

In the particular example shown, printed circuit board 24 includes a first surface area or space 50 along surface 48 (shown in FIG. 1) configured to receive and facilitate the mounting of component 26.

Component 26 generally comprises an electronic component configured to perform one or more functions associated with electronic device 20. In the embodiment shown, component 26 generates heat. In one embodiment, component 26 comprises a heat generating member and its associated heat sink. In other embodiments, component 26 may comprise other types of components.

Component 26 is electrically connected to circuit board 24 at space 50. When received at space 50, component 26 receives airflow created by fan 28 through opening 44, whereby heat generated by component 26 is removed or dissipated. As shown by FIG. 3, in some embodiments, space 50 may alternatively be void, omitting component 26.

Fan 28 is configured to create a forced airflow across surface 48 of printed circuit board 24 to cool components along printed circuit board 24. In one embodiment, fan 28 blows or forces air through opening 44 across surface 48 of printed circuit board 24 and across any components, such as component 26, located thereon. In other embodiments, fan 28 may alternatively be configured to draw air along surface 48 of printed circuit board 24 through opening 44. In other embodiments, fan 28 may alternatively be arranged at other locations relative to component 26. For example, in another embodiment, fan 28 may alternatively be arranged proximate to wall 42, wherein fan 28 blows air through openings contained within wall 42 towards electronic component 26 or wherein fan 28 draws air through openings within wall 42 across and away from component 26. Although fan 28 is illustrated as a single fan, fan 28 may alternatively comprise multiple fans or other devices are configured to create airflow.

Member 30 comprises one or more structures movably coupled to frame 22 opposite printed circuit 24 and component 26. For purposes of this disclosure, the term "coupled" means the joining of two members directly or indirectly to one another. Such joining may be stationary in nature or movable in nature. Such joining may be achieved with the two members or the two members and any additional intermediate members being integrally formed as a single unitary body with one another or with the two members or the two members and any additional intermediate member being attached to one another. Such joining may be permanent in nature or alternatively may be removable or releasable in nature. In the particular example illustrated, member 30 is pivotally coupled to frame 22 about a hinge or pivot axis 56. Member 30 pivots about pivot axis 56 between a raised position (shown in FIG. 1) and a lowered position (shown in FIGS. 2 and 3).

In the particular example illustrated, member 30 additionally includes pressure applying member 58. Pressure applying member 58 is coupled to member 30 and is configured to exert force upon component 26 so as to urge component 26 or a portion thereof towards face 48 of printed circuit board 24. The force created by pressure applying member 58 may serve to stabilize a connection between electronic component 26 and printed circuit board 24 against shock and vibration. In one embodiment, pressure applying member 58 may comprise a spring. In one application, pressure applying member 58 applies force to a heat sink element to urge the heat sink element against a processor card element of component 26.

Attachment mechanism 32 comprises a mechanism configured to releasably secure member 30 to wall 42 of frame 22 when in the lowered position shown in FIGS. 2 and 3. Attachment mechanism 32 includes a first portion 60 supported by member 30 and a second portion 62 supported by wall 42. Portions 60 and 62 cooperate to join to one another. In one embodiment, one of portions 60, 62 may comprise a hook while the other portion 60, 62 comprises a detent. In another embodiment, one of portions 60, 62 may comprise a latch while the other of portions 60, 62 comprise a latch receiving member. In other embodiments, attachment mechanism 32 may be supported solely by member 30 or solely by wall 42. In still other embodiments, wall 42 may be omitted and attachment mechanism 32 may alternatively be supported by floor 38 of frame 22. In such an embodiment, member 30 may include a downwardly extending portion which extends to floor 38 of frame 22. In still other embodiments, attachment mechanism 32 may be omitted. Attachment mechanism 32 secures member 30 to frame 22 so as to partially compress pressure applying member 58 between member 30 and component 26 such that pressure applying member 58 applies force to component 26.

Baffle 34 comprises one or more structures configured to block, partially or completely, airflow across surface 48 of printed circuit board 24. In one embodiment, baffle 34 comprises an elongate planar somewhat rigid imperforate panel or sheet. Baffle 34 is movably coupled to member 30 and is carried by member 30. As shown by FIGS. 2 and 3, baffle 34 moves between an extended position (shown in FIG. 3) which is maintained in the absence of component 26 in space 50 to a retracted position (shown in FIG. 2) in response to engaging component 26 in space 50. In particular, as member 30 is pivoted about pivot axis 56 from the raised position in FIG. 1 to the lowered position in FIG. 2 or 3, the lower end 64 of baffle 34 falls under the force of gravity relative to member 30 towards printed circuit board 24 in the absence of component 26. In the particular example illustrated, lower end 64 of baffle 34 extends in close proximity with surface 48 of printed circuit board 24. In one embodiment, lower end 64 engages surface 48. In other embodiments, lower end 64 may be raised above surface 48 while still at least partially blocking airflow.

As shown by FIG. 2, in the presence of component 26, lower end 64 of baffle 34 engages component 26. As member 30 is pivoted towards the lowered position, baffle 34 slides relative to member 30 through aperture 66. As a result, baffle 34 automatically adapts to the particular height of electronic component 26. In the particular example shown, baffle 34 blocks airflow above component 26 and between component 26 and member 30. Although baffle 34 is shown in FIG. 2 as maintaining its shape above member 30, in other embodiments, baffle 34 may alternatively be formed from a flexible material so as to coil, fold or bend above member 30 within a cavity above member 30 to conserve space. Although baffle 34 is illustrated as moving to the extended position shown in FIG. 3 under the force of gravity, baffle 34 may alternatively be resiliently biased towards the extended position by other means. For example, the upper end 68 or other portions of baffle 34 may additionally be engaged by a resilient spring to resiliently bias baffle 34 towards the extended position.

Overall, baffle 34 automatically adapts and responds to the presence of an electronic component, such as component 26, within space 50 to appropriately block airflow across space 50. In addition to automatically responding to the presence of a component within space 50, baffle 34 also automatically adapts to the size or height of component 26. As a result, baffle 34 blocks airflow across space 50 as needed to assist in directing airflow across other spaces along printed circuit board 24 which have heat generating components and which may benefit from cooling provided by increased airflow.

Figure 4:
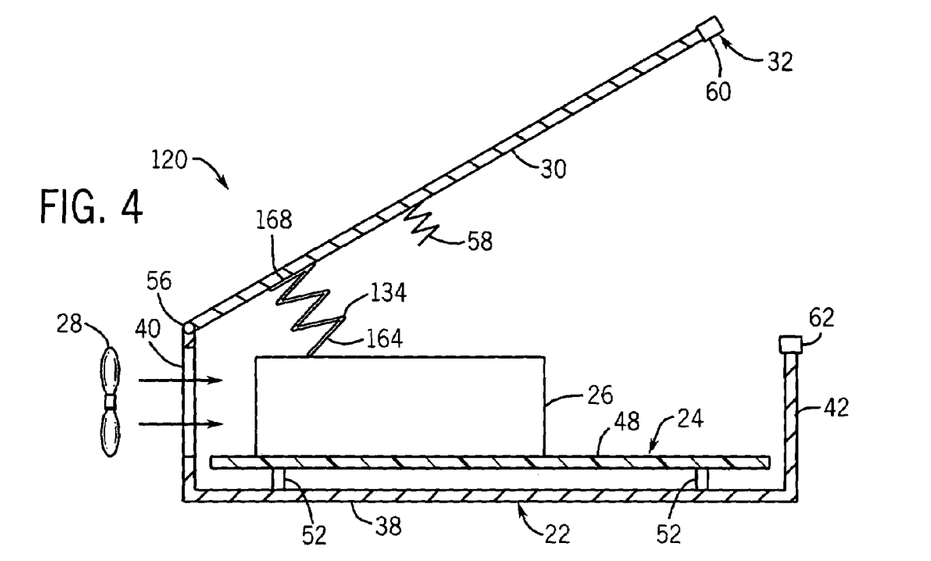
FIG. 4 is a sectional view schematically illustrating another embodiment of the electronic device of FIG. 1 having a member carrying a baffle and in a raised position according to one exemplary embodiment.
Figure 5:
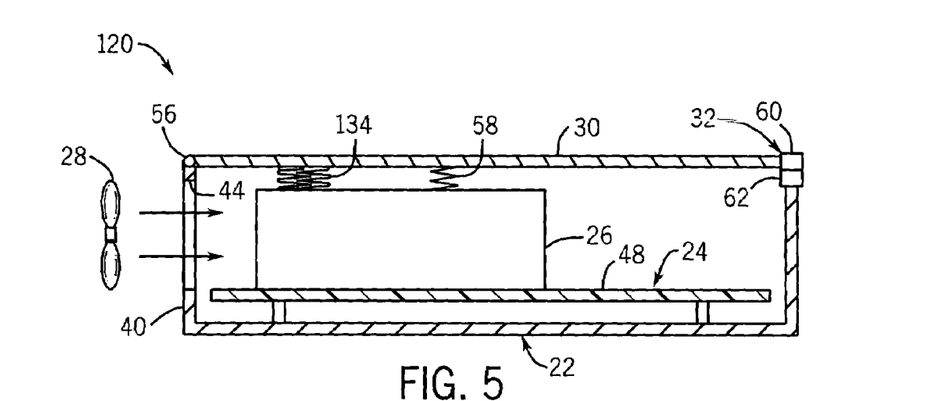
FIG. 5 illustrates the electronic device of FIG. 4 with the member in a lowered position in the presence of an electronic component according to one exemplary embodiment.
Figure 6:
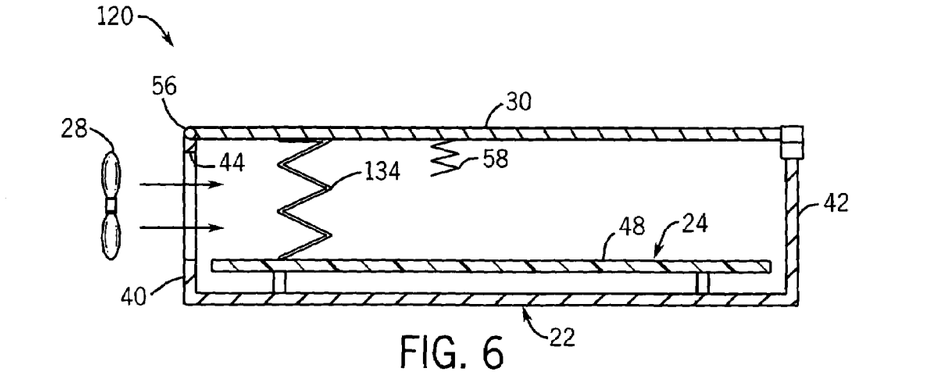
FIG. 6 illustrates the electronic device of FIG. 4 with the member in a lowered position in the absence of an electronic component according to one exemplary embodiment.

FIGS. 4-6 schematically illustrate electronic device 120, another embodiment of device 20 shown in FIGS. 1-3. Electronic device 120 is similar to electronic device 20 except that electronic device 120 includes baffle 134 in lieu of baffle 34. For purposes of illustration, those remaining elements of device 120 which correspond to elements of device 20 are number similarly. Baffle 134 generally comprises a compressible structure, such as an accordion-like structure or a foam or sponge-like material capable of being compressed and configured to resiliently return at least partially towards its initial configuration after being compressed. In the embodiment illustrated, baffle 134 comprises an accordion-like structure having a lower portion 164 and a generally opposite upper portion 168 coupled to member 30. As shown by FIG. 5, when member 30 is lowered or is moved to the lower position and when a component 26 is in space 50, lower portion 164 engages component 26 and is folded or compressed between component 26 and member 30. As shown in FIG. 5, when in the retracted position, baffle 134 includes a plurality of overlapping sections and folds.

As shown by FIG. 6, when component 26 is absent, baffle 134 decompresses or unfolds such that lower portion 164 extends closer to surface 48 of printed circuit board 24. In the particular example shown, baffle 134 folds out until lower portion 164 contacts surface 48 of printed circuit board 24. As a result, baffle 34 automatically blocks airflow across printed circuit board 24 in the absence of a component 26 in space 50. Baffle 34 automatically is maintained in a retracted or compressed position shown in FIG. 5 in the presence of component 26. Like baffle 34, baffle 134 automatically adapts to varying heights of component 26. In another embodiment, member 58 may be omitted wherein baffle 134 also serves the function of member 58 by applying force to component 26 similar to the force applied by member 58.

Figure 7:
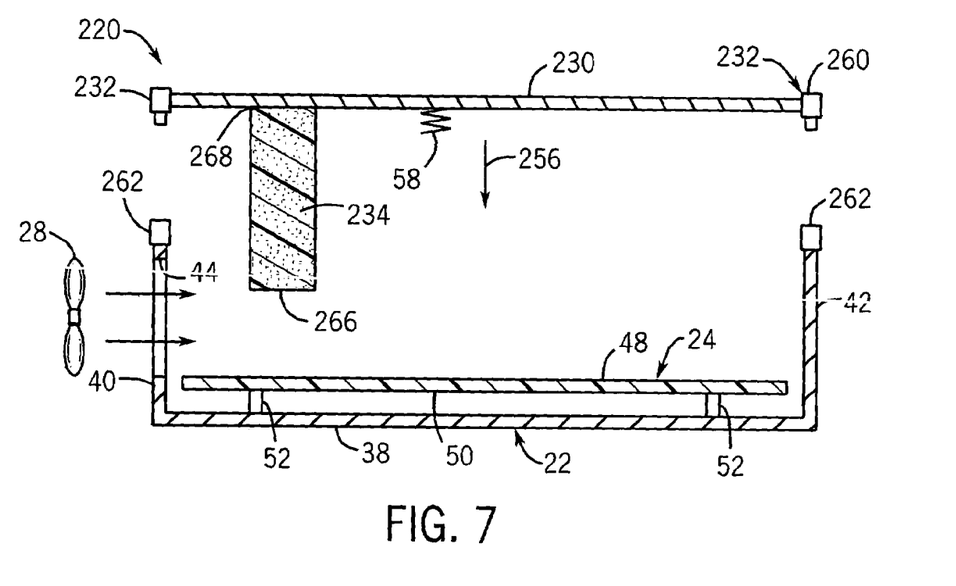
FIG. 7 is a sectional view schematically illustrating another embodiment of the electronic device of FIG. 1 having a member carrying a baffle and detached from a frame of the device according to one exemplary embodiment.

FIG. 7 schematically illustrates device 220, another embodiment of device 20 shown in FIG. 1. Device 220 is similar to device 120 except that device 220 includes member 230 in lieu of member 30, attachment mechanisms 232 in lieu of attachment mechanisms 32 and baffle 234 in lieu of baffle 134. Member 230 is similar to member 30 except that member 230 is configured to be removably attached to frame 22. In lieu of being pivoted, member 230 is configured to be lowered in the direction indicated by arrow 256 to mount member 230 to frame 22. In the particular example shown, member 230 is configured to be lowered while extending in a plane substantially parallel to a plane in which printed circuit board 24 extends. In other embodiments, member 230 may be removably mounted to frame 22 in other fashions.

Attachment mechanisms 232 extend along opposite portions of member 230 and along walls 40 and 42. Each attachment mechanism 232 includes member portion 260 and a frame portion 262 which cooperate with one another to releasably secure member 230 to frame 22. In one particular embodiment, one of portions 260, 262 includes a vertical track or channel while the other of portions 260, 262 includes a projection configured to be slidably received within the track or channel to guide insertion of member 230 relative to frame 22. In one embodiment, portions 260, 262 further latch member 230 to frame 22. In other embodiments, portions 260, 262 may comprise other structures configured to releasably secure and potentially align member 230 relative to frame 22.

Baffle 234 generally comprises a mass of resiliently compressible material having a lower end 266 and an opposite upper end 268 secured to member 230. Baffle 234 has a sufficient dimension between ends 266 and 268, in an uncompressed state, to block airflow across space 50 in the absence of component 26. In lieu embodiment, end 266 extends into close proximity to surface 48 of printed circuit board 24. In one embodiment, end 266 is spaced from surface 48 by a distance less than or equal to 10 mm and nominally less than or equal to 5 mm.

In the presence of component 26, baffle 234 is compressed (and possibly bent, deformed or folded) as member 230 is lowered and connected to frame 22. Baffle 234 is maintained in its compressed state in the presence of component 26. Upon removal of component 26 or upon separation of member 230 from frame 22, baffle 234 decompresses and substantially returns to its initial configuration. In lieu of having baffle 134, system 220 may alternatively include baffle 34 or other baffle configurations.

Figure 8:
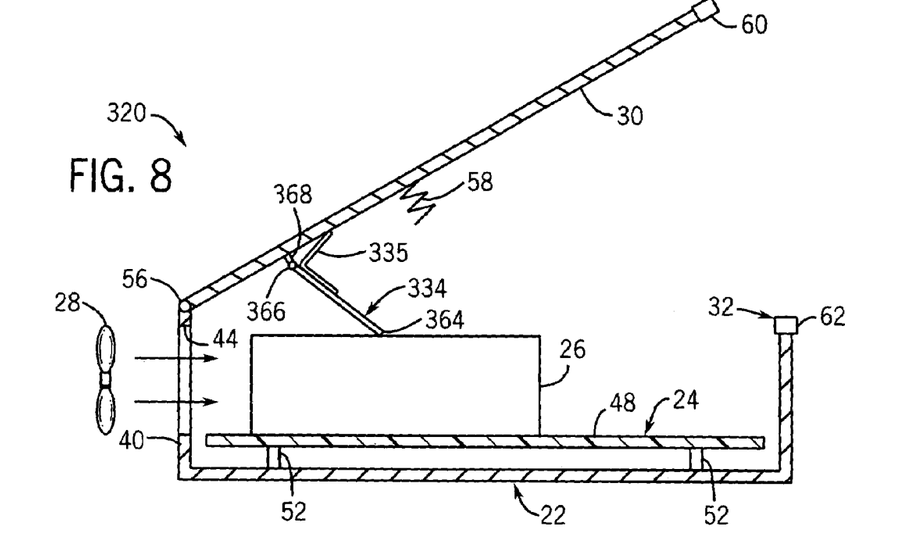
FIG. 8 is a sectional view schematically illustrating another embodiment of the electronic device of FIG. 1 having a member carrying a baffle and in a raised position according to one exemplary embodiment.
Figure 9:
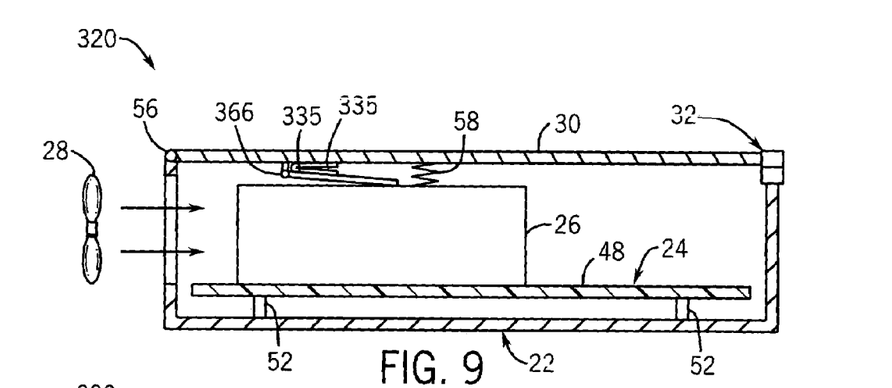
FIG. 9 illustrates the electronic device of FIG. 8 with the baffle in a lowered position in the presence of an electronic component according to one exemplary embodiment.
Figure 10:
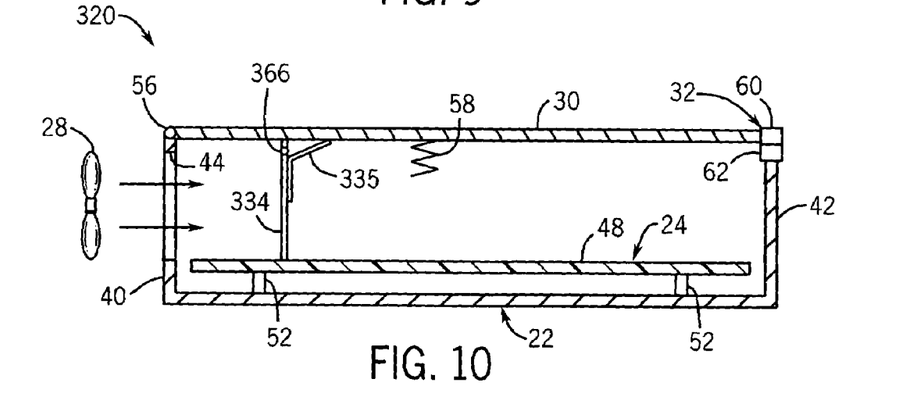
FIG. 10 illustrates the electronic device of FIG. 8 with the member in a lowered position in the absence of an electronic component according to one exemplary embodiment.

FIGS. 8-10 schematically illustrate electronic device 320, another embodiment of electronic device 20. Electronic device 320 is similar to electronic device 20 except that electronic device 320 includes baffle 334 in lieu of baffle 34 and additionally includes spring 335. Those remaining elements of device 320 which correspond to device 20 are numbered similarly. Like baffles 34 and 134 of devices 20 and 120, respectively, baffle 334 is supported and carried by member 30. Baffle 334 generally comprises an elongate substantially imperforate structure or structures having a lower end 364 and an upper end 368 pivotally coupled to member 30 about a hinge or pivot axis 366. As a result, baffle 334 pivots relative to member 30 between an extended position (shown in FIG. 10) which is maintained in the absence of component 26 in space 50 and a retracted position in response to lower end 364 engaging a component 26 in space 50 as shown in FIG. 9. In the particular example illustrated, baffle 334 has a length sufficient such that lower end 364 extends proximate to surface 48 of printed circuit board 24 in the absence of component 26. In the particular example shown, lower end 364 abuts surface 48 of printed circuit board 24 in the absence of component 26 in space 50.

Spring 335 comprises a spring-like member between baffle 334 and member 30. Spring 335 is configured to resiliently bias or urge baffle 334 towards the extended position. In the particular example, spring 335 comprises a leaf spring coupled to both baffle 334 and member 30. In other embodiments, spring 335 may comprise other resilient biasing springs or mechanisms. In still other embodiments, spring 335 may be omitted, wherein end 334 is biased towards the extended position by the force of gravity. Similar to the combination of member 58 and baffle 134 described above with respect to FIG. 6, in an alternative embodiment, a stronger version of spring 335 could be used to sufficiently urge baffle 334 against component 26 to apply sufficient pressure to component 26 such that spring 58 may be omitted.

Figure 11:
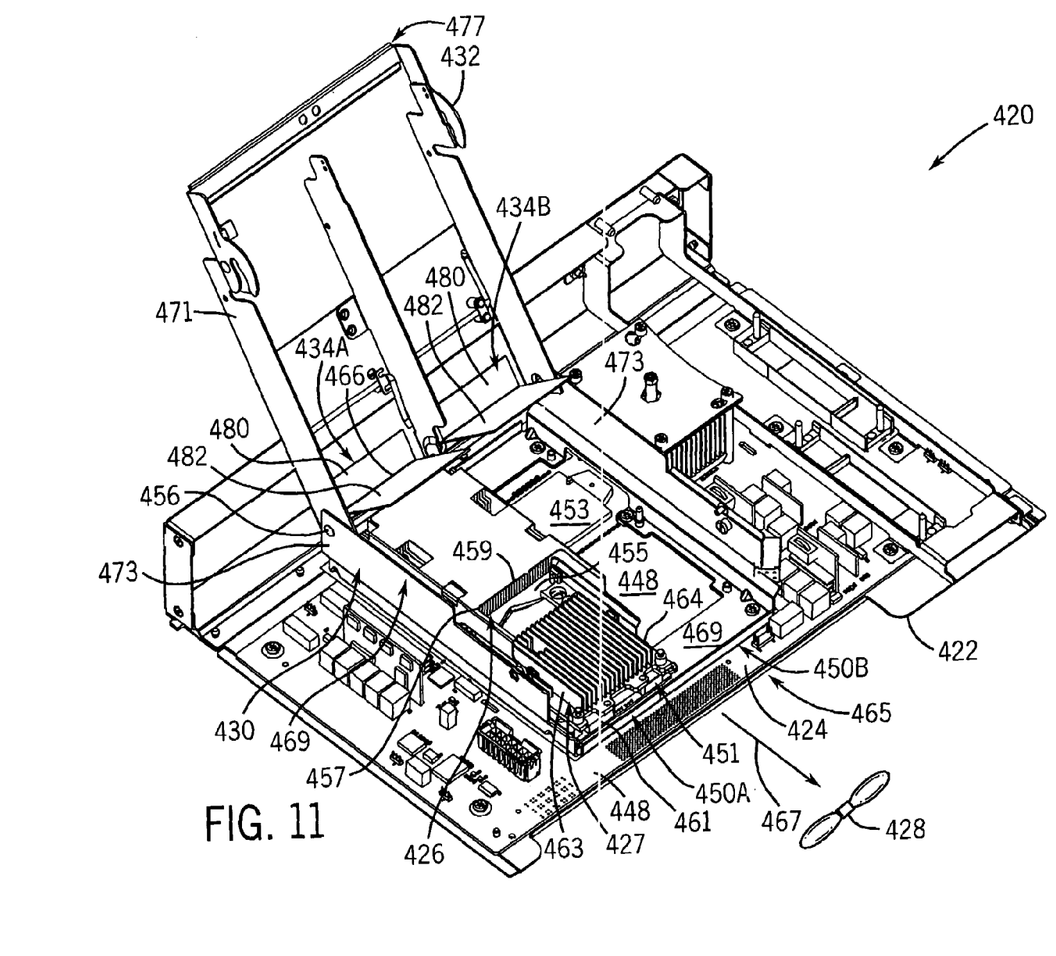
FIG. 11 is a top perspective view of another embodiment of the electronic device of FIG. 1 having a member carrying baffles and in a raised position according to one exemplary embodiment.
Figure 12:
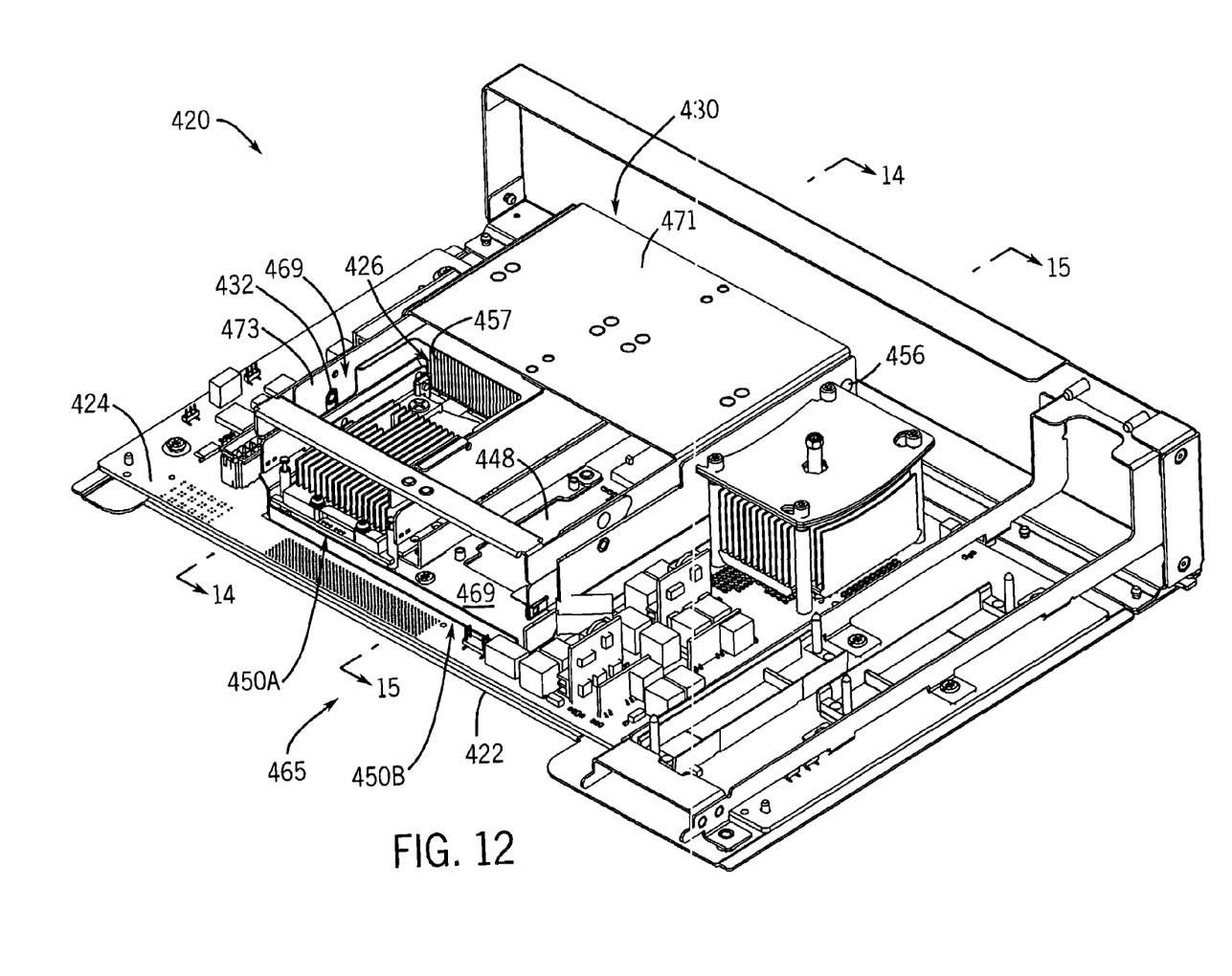
FIG. 12 is a top perspective view of the electronic device of the electronic device of FIG. 1 with the member in a lowered position according to one exemplary embodiment.

FIGS. 11-15 illustrate electronic device 420, another embodiment of electronic device 20. As shown by FIG. 11, electronic device 420 generally includes frame 422, printed circuit board 424, electronic component 426, fan 428, retainer 430, attachment mechanism 432 and baffles 434A and 434B. In the particular example, electronic device 420 comprises a server. In other embodiments, electronic device 420 may be alternatively configured. Frame 420 generally comprises a structure which serves as a base or foundation for supporting the remaining elements of electronic device 420. In the particular example illustrated, frame 422 further stiffens and rigidifies printed circuit board 424 to protect printed circuit board 424. In one embodiment, frame 422 is formed from sheet metal. In other embodiments, frame 422 may be formed from other materials and may have other shapes or configurations.

Printed circuit board 424 provides an electrical interface between the electrical components connected printed circuit board 424. In the particular example illustrated, printed circuit board 424 is coupled to frame 422 by spaces, posts or standoffs 452. In other embodiments, printed circuit board 424 may be mounted to frame 422 by other members.

Printed circuit board 424 has a face 448 facing away from frame 422 and configured to be electrically connected to the electrical components. In the particular example shown, face 448 of printed circuit board 424 provides two side-by-side sockets 450A, 450B which provide spaces for processor units such as processor unit 451. In the particular example shown, each component location 450A, 450B includes a connector 453, also known as a socket, configured to connect a processor unit 451 to printed circuit board 424. In the example shown, connector 453 is configured to releasably connect a processor card of processor unit 451 to printed circuit board 24. In one embodiment, connector 453 may comprise a ZIF connector. In other embodiments, connector 453 may have other configurations.

Processor unit 451 comprises an assembly of multiple electrical components including electronic component 426 and electronic component 427. Electronic component 426 generally includes processor 455 and heat sink 457. Processor 455 is configured to mount to printed circuit board 424 via connector 453. Processor 455 generates heat during its operation. This heat is dissipated by heat sink 457.

Heat sink 457 comprises a member configured to draw heat away from processor 455 and to disperse the withdrawn heat over a relatively larger surface area to facilitate cooling. In the embodiment shown, heat sink 457 includes a plurality of generally parallel fins 459 of material having high thermal conductivity so as to dissipate heat across a large surface area. In other embodiments, heat sink 457 may have other configurations.

Electronic component 427 is associated with electronic component 426. In the example shown, electronic 427 is assembled and coupled to electronic component 426 such that electronic components 426 and 427 are joined as a single unit 451. Electronic component 427 generally includes power pod 461 and heat sink 463. Power pod 461 generally comprises a device configured for transforming and providing electrical power to processor 455. One example of power pod 461 is provided in co-pending U.S. patent application Ser. No. 10/803,399 filed on Mar. 18, 2004 by Stephan K. Barsun, Christian L. Belady, Roy M. Zeighami and Christopher G. Malone and entitled "Heat Dissipating Arrangement," the full disclosure of which is hereby incorporated by reference.

Heat sink 463 generally comprises a member configured to draw heat away from power pod 461 and to disperse the withdrawn heat over a relatively larger surface to facilitate cooling. In the embodiment shown, heat sink 463 includes a plurality of generally parallel fins 464 of material having a high thermal conductivity so as to dissipate heat across a large surface area. In other embodiments, heat sink 463 may have other configurations. Although electronic device 420 is illustrated as providing sockets 450A, 450B for potentially two side-by-side processor units, one of which is shown, printed circuit board 424 may alternatively be configured to provide a socket for a single processor unit 451 or to provide sockets for greater than two processor units 451. In lieu of processor units 451, sockets 450A, 450B may alternatively be configured to electrically connect multiple electronic components which are not joined as a unit. For example, electronic components 426 and 427 may alternatively be independently mounted to printed circuit board 424.

Fan 428, schematically shown, comprises one or more fans configured to create airflow across printed circuit board 424. In the example illustrated, fan 428 is located proximate to end 465 and is configured to draw air across printed circuit board 424 and through heat sinks 457 and 463 of electronic components 426 and 427, respectively, in the general direction indicated by arrow 467. In other embodiments, fan 428 may alternatively be configured to force air across printed circuit board 424 in a direction opposite to the direction indicated by arrow 467. In other embodiments, fan 428 may be provided at other locations relative to printed circuit board 424 and electronic components 426 and 427.

Retainer 430 comprises an arrangement of one or more members configured to secure and retain electronic component 426 relative to printed circuit board 424. In the particular example shown, retainer 430 is configured to stabilize electronic component 426 against shock and vibration to enhance reliability of the electrical connection between processor 455 and connector 453. Retainer 430 generally comprises a clam shell arrangement including a base or frame work 469 and actuatable member 471. Frame work 469 comprises one or more relatively rigid structures mounted to printed circuit board 424 and configured to movably support actuatable member 471. In the particular example illustrated, frame work 469 extends along surface 448 and outlines sockets 450A and 450B. In other embodiments, in lieu of outlining sockets 450A, 450B, frame work 469 may outline a single socket or greater than two sockets. In the particular example shown, frame work 469 includes sidewalls 473 which generally extend on opposite sides of 450A and 450B. Sidewalls 430 serve as structures for mounting actuatable member 471. Sidewalls 473 also support portions of attachment mechanism 432. In the example shown, sidewalls 473 additionally guide airflow across sockets 450A and 450B. In the particular example illustrated, frame work 469 is formed from a relatively rigid material such as sheet metal. In other embodiments, frame work 469 may be formed from other materials and may have other shapes and configurations.

Actuatable member 471 comprises one or more structures movably coupled relative to printed circuit board 424. In the particular example shown, member 471 is movably coupled to printed circuit board 424 indirectly by being pivotally connected to frame work 469. In particular, member 471 is pivotally connected to frame work 469 about a hinge or pivot axis 456. Member 471 pivots between the raised position shown in FIG. 11 and a lowered position shown in FIGS. 12-15.

Attachment mechanism 432 releasably secures end 477 of member 471 to frame work 469 such that member 471 abuts component 426 or another component (not shown) connected to printed circuit board 424 via connector 453 and socket 450B. Although attachment mechanism 432 is illustrated as a latch coupled to both sides of member 431, attachment mechanism 432 may alternatively comprise other mechanisms, such as screws, fasteners and the like, for securing end 477 to frame work 469 or alternatively to printed circuit board 424 or frame 422 in the lowered position.

Baffles 434A and 434B comprise structures movably coupled relative to member 471 which are configured to move between an extended position (shown in FIG. 15) which is maintained in the absence of a component in the associated socket 450A, 450B to a retracted position (shown in FIG. 14) in response to engaging a component within the associated socket 450A, 450B. In the particular example shown, baffle 450A is configured to at least partially block airflow across socket 450A while baffle 450B is configured to at least partially block airflow across socket 450B when in the extended positions. Baffles 434A and 434B independently move between the extended and retraced positions based upon the presence and configuration of an electronic component in the opposite corresponding space.

In the particular example shown, baffle 434A and baffle 434B are substantially similar to one another. Each baffle 434A and baffle 434B includes mounting portion 480 and a blocking portion 482. Mounting portion 480 is secured to member 471 and mounts the remainder of baffles 434A, 434B to member 471.

Figure 13:
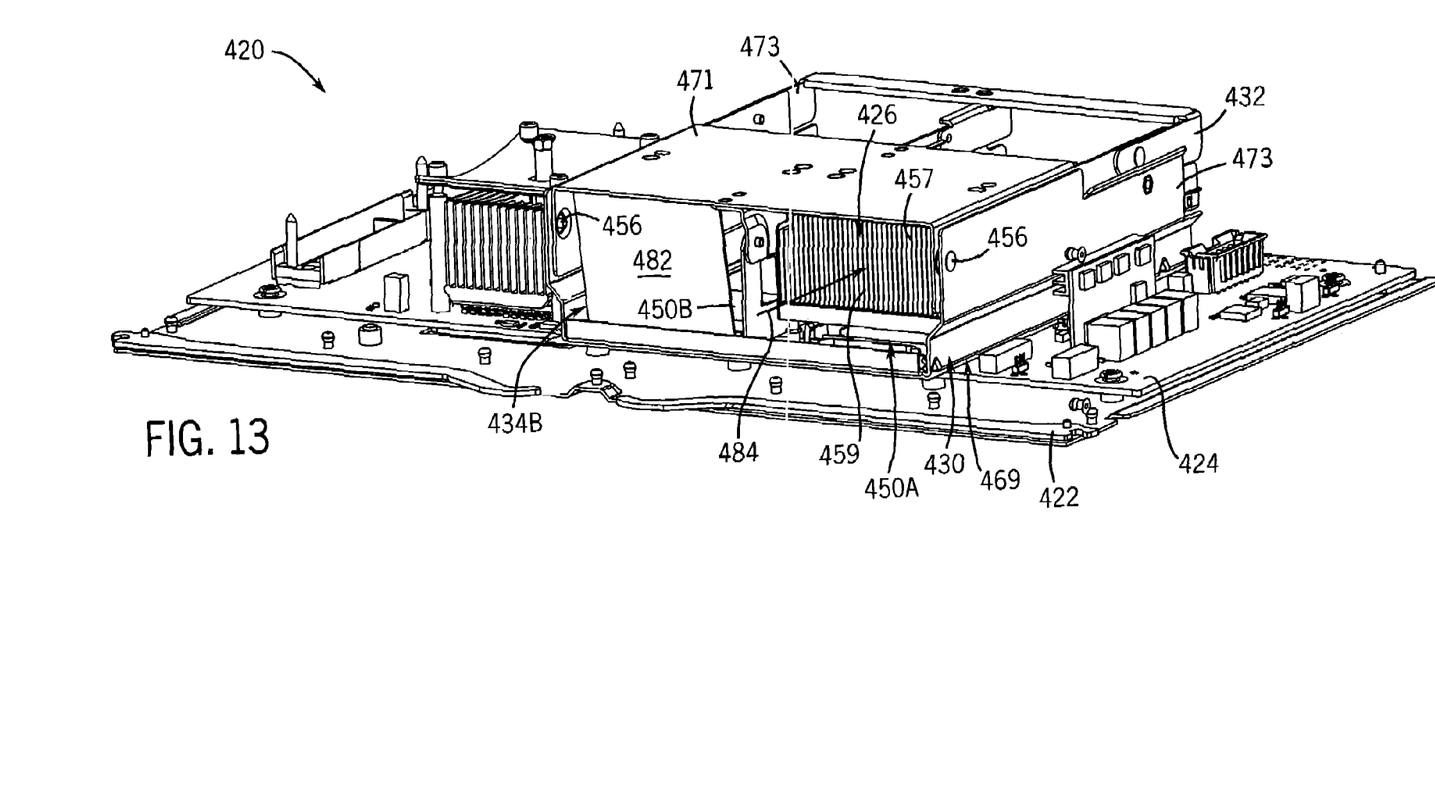
FIG. 13 is a rear perspective view of the electronic device of FIG. 12 according to one exemplary embodiment.
Figure 14:
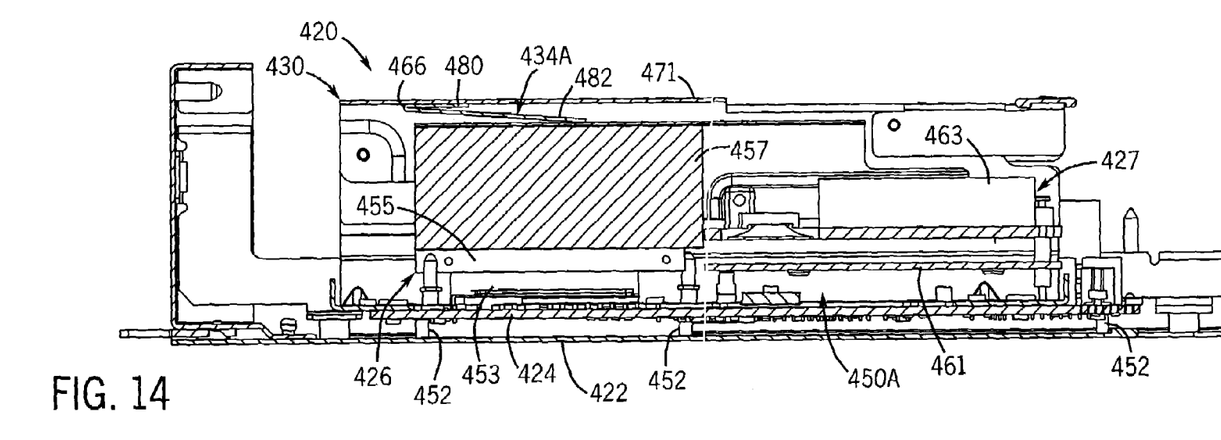
FIG. 14 is a sectional view of the electronic device of FIG. 12 taken along line 14-14 according to one exemplary embodiment.
Figure 15:
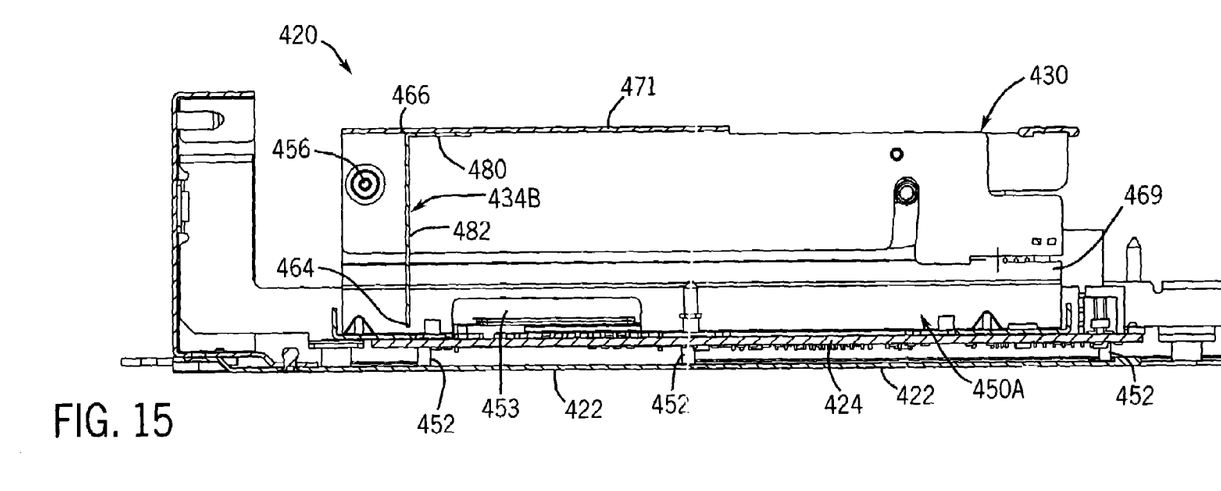
FIG. 15 is a sectional view of the electronic device of FIG. 12 taken along line 15-15 according to one exemplary embodiment.

Blocking portion 482 is generally an imperforate panel or flap extending from mounting portion 480 and pivoting with respect to mounting portion 480 about pivot axis 466 between an extended position shown in FIG. 15 and a retracted position shown in FIG. 14. In the particular example shown, pivot axis 466 is provided by a living hinge (i.e., a material that bends, flexes or otherwise deforms). In the particular example shown, blocking portion 482 and mounting portion 480 are integrally formed as a single unitary body, wherein a fold forms pivot axis 466. In one embodiment, mounting portion 480 and blocking portion 482 are formed from one or more materials which collectively provide blocking portion 482 with a resiliency with respect to mounting portion 480 such that during movement of member 471 from the lowered position shown in FIGS. 12-15 to the raised position shown in FIG. 11, mounting portion 482 resiliently returns or springs back to an extended or near extended position. In one embodiment, mounting portion 480 and blocking portion 482 are integrally formed as a single unitary body out of a resilient polymeric material having an appropriate thickness and configuration so as to be resilient. One example of such a material includes polypropylene. Other such materials include polyethylene or thermoplastic polyester elastomer (TPE). In still other embodiments, blocking portion 482 may be mounted or fastened to mounting portion 480 and pivot axis 466 may be provided by another hinge structure.

In operation, member 471 may be initially pivoted about pivot axis 456 to the raised position shown in FIG. 11 to provide access to the electronic components within sockets 450A and 450B. Such access may be used to remove, add, replace or repair an electronic component. Thereafter, member 471 may be pivoted about pivot axis 456 to the lowered position shown in FIGS. 12-15. In the example illustrated, socket 450A is occupied by processor unit 451. During pivot movement of member 471, blocking portion 482 of baffle 434A engages electronic component 426 which causes blocking portion 482 of baffle 434A to be folded or compressed to a retracted position towards member 471 as shown in FIG. 14. In this retracted position, mounting portion 482 of baffle 434A is contained between electronic component 426 and member 471 to block airflow across a top (as seen in FIG. 14) of electronic component 426. As shown by FIG. 13, airflow through heat sink 457 of component 426 in the direction indicated by arrow 484 is not substantially obstructed to facilitate cooling of electronic component 426. The resilient nature of baffle 434A may result in mounting portion 482 automatically extending downward to block a greater volume when electronic component 426 has a lesser height.

In other embodiments, baffles 434A and 434B may alternatively include resilient springs for resiliently biasing mounting portions 482 towards the extended position. In still other embodiments, baffles 434A and 434B may alternatively be replaced by sliding or accordion-like baffles such as baffles 34 and 134 described with respect to FIGS. 1-6 or a foam-like material such as baffle 234 shown in FIG. 7.

In the example illustrated, socket 450B is devoid of a processor unit, such as processor unit 451. As a result, as shown by FIG. 15, baffle 434B automatically extends to the extended position shown in FIGS. 13 and 15. In the extended position, blocking portion 482 of baffle 434B extends away from member 471 into close proximity with printed circuit board 424 in socket 450B which is not occupied. In the particular example shown, end 464 of baffle 434B is spaced from printed circuit board 424 by a distance less than or equal to about 10 mm and nominally less than or equal to about 5 mm. In the embodiment illustrated, blocking portion 482 extends substantially perpendicular to printed circuit board 424 when in the extended position. In other embodiments, blocking portion 482 may extend oblique relative to printed circuit board 424 when in the extended position.

As shown by FIG. 13, blocking portion 482 substantially blocks airflow into or across socket 450B. Although blocking portion 482 may not completely seal off or block all airflow, blocking portion 482 sufficiently fills the opening to sufficiently block airflow so as to simulate resistance of an electronic component in socket 450B or to provide a similar pressure drop had an electronic component been positioned within socket 450B. As a result, airflow across sockets 450A and 450B is balanced or even greater airflow is created through socket 450A occupied by electronic component 426.

Because blocking portion 482 of baffle 434B automatically repositions itself to either the extended position or the retracted position based upon whether socket 450B is occupied, baffle 434B may remain coupled to member 471 without a person having to remember to attach or detach baffle 434B. Although electronic device 420 has been illustrated as including baffles 434a and 434B for sockets 450A and 450B, respectively, in some embodiments, one of baffles 434A and 434B may be omitted where its corresponding socket 450A, 450B is always occupied by a processor unit 451.

Although the present disclosure has been described with reference to example embodiments, workers skilled in the art will recognize that changes may be made in form and detail without departing from the spirit and scope of the claimed subject matter. For example, although different example embodiments may have been described as including one or more features providing one or more benefits, it is contemplated that the described features may be interchanged with one another or alternatively be combined with one another in the described example embodiments or in other alternative embodiments. Because the technology of the present disclosure is relatively complex, not all changes in the technology are foreseeable. The present disclosure described with reference to the example embodiments and set forth in the following claims is manifestly intended to be as broad as possible. For example, unless specifically otherwise noted, the claims reciting a single particular element also encompass a plurality of such particular elements.

What is claimed is:

1. An apparatus comprising:
   a printed circuit board having a first space;
   a member configured to be coupled to the printed circuit board; and
   a first baffle carried by the member, wherein the baffle is configured to move from an extended position, which is maintained in the absence of a component in the first space, to a retracted position in response to engaging a component in the first space.

2. The apparatus of claim 1, wherein the member is pivotally coupled to the printed circuit board.

3. The apparatus of claim 2, wherein the first baffle is pivotally coupled to the member.

4. The apparatus of claim 1, wherein the first baffle is pivotally coupled to the member.

5. The apparatus of claim 1, wherein the first baffle is slidably coupled to the member.

6. The apparatus of claim 1, wherein the first baffle includes a plurality of overlapping sections when in the retracted position.

7. The apparatus of claim 1, wherein the first baffle extends substantially perpendicular to the member in the extended position.

8. The apparatus of claim 7, wherein the first baffle extends substantially perpendicular to the member in the retracted position.

9. The apparatus of claim 7, wherein the first baffle extends non-perpendicular to the member when in the retracted position.

10. The apparatus of claim 1, wherein the first baffle is resiliently biased towards the extended position.

11. The apparatus of claim 1 including a spring resiliently biasing the baffle towards the extended position.

12. The apparatus of claim 1, wherein the first baffle extends from the member to the printed circuit board in the extended position.

13. The apparatus of claim 12, wherein the first baffle is spaced less than or equal to 10 mm from the printed circuit board in the extended position.

14. The apparatus of claim 1 including a component in the first space, wherein the component engages the first baffle to retain the baffle in the retracted position.

15. The apparatus of claim 14, wherein the component includes a heat sink.

16. The apparatus of claim 15, wherein the heat sink includes a plurality of fins.

17. The apparatus of claim 1 including a fan configured to create air flow across the printed circuit board.

18. The apparatus of claim 1, wherein the printed circuit board has a second space configured to be connected to a second component.

19. The apparatus of claim 18 including a second baffle carried by the member, wherein the second baffle is configured to move from an extended position, which is maintained in the absence of a component in the second space, to a retracted position in response to engaging a component in the second space.

20. The apparatus of claim 1 including a component in the first space, wherein the component includes a heat sink and a heat generating element between the heat sink and the printed circuit board.

21. The apparatus of claim 20, wherein the member clamps the heat sink towards the heat generating element.

22. The apparatus of claim 21, wherein the heat generating element comprises a processor.

23. The apparatus of claim 21 including at least one frame coupled to the printed circuit board, wherein the member has a first portion pivotally coupled to the at least one frame and a second portion secured to the at least one frame.

24. The apparatus of claim 1, wherein the first baffle includes a first portion mounted to the member and a second portion integrally formed as a single unitary body with the first portion and pivotable relative to the first portion between the extended position and the retracted position.

25. The apparatus of claim 24, wherein the first portion and the second portion are at least partially formed from a resilient material.

26. The apparatus of claim 25, wherein the material is polymeric.

27. The apparatus of claim 1, wherein the member pivots about a first axis relative to the printed circuit board and wherein the first baffle pivots about a second axis relative to the printed circuit board.

28. The apparatus of claim 27, wherein the first axis and the second axis are parallel.

29. The apparatus of claim 1, wherein the first baffle includes a compressible cellular material.

30. A processing unit clamp system for use with a frame coupled to a printed circuit board that is connected to a processor unit having a processor and a heat sink, the system comprising:
    a member having a first portion configured to be pivotally coupled to the at least one frame so as to be pivoted to apply force to the processor unit; and
    a baffle carried by the member, the baffle being configured to move from an extended position, which is maintained in the absence of the processor unit connected to the printed circuit board, to a retracted position in response to engaging the processor unit connected to the printed circuit board.

31. An apparatus comprising:
    a printed circuit board having a space configured to receive a component;
    a member movably coupled to the printed circuit board; and
    means carried by the member for blocking air flow across the space in absence of a component in the space and for automatically retracting from the space in response to engaging a component in the space.

32. The apparatus of claim 31, wherein the member includes means for urging a component in the space towards the printed circuit board.

33. A method comprising:
    moving a baffle towards a space along a printed circuit board; and
    engaging the baffle against a component in the space to retract the baffle away from the printed circuit board.

34. The apparatus of claim 33, wherein moving the baffle includes pivoting the baffle about a first axis.

35. The method of claim 34, wherein retracting the baffle includes pivoting the baffle about a second distinct axis.

36. The method of claim 33, wherein retracting the baffle includes sliding the baffle.

37. The method of claim 33, wherein retracting the baffle includes folding the baffle.

38. The method of claim 33, wherein retracting the baffle includes pivoting the baffle.

39. The method of claim 33, wherein the baffle is carried by a member and wherein the method further includes applying force to the component by moving the member towards the printed circuit board.

* * * * *